(12) United States Patent
Wu et al.

(10) Patent No.: US 8,369,087 B2
(45) Date of Patent: Feb. 5, 2013

(54) COMPUTER SERVER SYSTEM

(75) Inventors: Hung-Yi Wu, Taipei Hsien (TW); Xiao-Zhu Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 285 days.

(21) Appl. No.: 12/795,609

(22) Filed: Jun. 7, 2010

(65) Prior Publication Data

US 2011/0261529 A1    Oct. 27, 2011

(51) Int. Cl.
*H05K 5/00* (2006.01)
*H05K 7/00* (2006.01)

(52) U.S. Cl. .............. 361/679.58; 361/724; 361/725; 361/726; 361/727

(58) Field of Classification Search .......... 361/679.58, 361/724, 725, 726, 727
See application file for complete search history.

(56) References Cited

U.S. PATENT DOCUMENTS

| | | | | |
|---|---|---|---|---|
| 6,856,505 | B1 * | 2/2005 | Venegas et al. | 361/679.05 |
| 7,394,660 | B2 * | 7/2008 | Hidaka | 361/727 |
| 7,403,396 | B2 * | 7/2008 | Belady et al. | 361/727 |
| 7,633,760 | B2 * | 12/2009 | Wu et al. | 361/727 |
| 2004/0120106 | A1 * | 6/2004 | Searby et al. | 361/683 |
| 2008/0062654 | A1 * | 3/2008 | Mattlin et al. | 361/727 |

* cited by examiner

*Primary Examiner* — Anthony Haughton
(74) *Attorney, Agent, or Firm* — Altis Law Group, Inc.

(57) ABSTRACT

A computer server system includes a server cabinet, and at least one server accommodated in the server cabinet. The server forms a fixing structure at each of four corners thereof. In addition, the server cabinet includes fixing structures which are correspondingly matched with the fixing structures of the server. The fixing structure of the server cabinet can be in the form of protrusions, mounting holes, and engagement holes. The fixing structure of the server can be in the form of ears and mounting grooves. The server is mounted in the server cabinet by means of the fixing structures thereof.

9 Claims, 6 Drawing Sheets

COMPUTER SERVER SYSTEM

BACKGROUND

1. Technical Field

The present disclosure relates to computer servers, and more particularly to a computer server system including a server cabinet and a plurality of servers received in the server cabinet, which has simpler fixing structures formed on the server cabinet and the servers.

2. Description of Related Art

Computer server systems often include multiple number of standard servers mounted in a standard server cabinet. Each server is a stand-alone computer that can include many electronic components, such as one or more processors, RAM, fixed disks, AC to DC power supplies, and the like.

The server cabinet usually contains several pairs of rails. Each of the rails defines a sliding groove therein. Two opposite sides of each server respectively match the sliding grooves of a corresponding pair of rails. The two sides of each server are slidably received in the sliding grooves of the corresponding rails, and are secured in the server cabinet by the rails. However, the rails possess more complicated structures and are more difficult to fabricate, which thereby increases manufacturing costs of the server cabinet.

Thus, it is desirable to overcome the described limitations.

DETAILED DESCRIPTION

Figure 1:
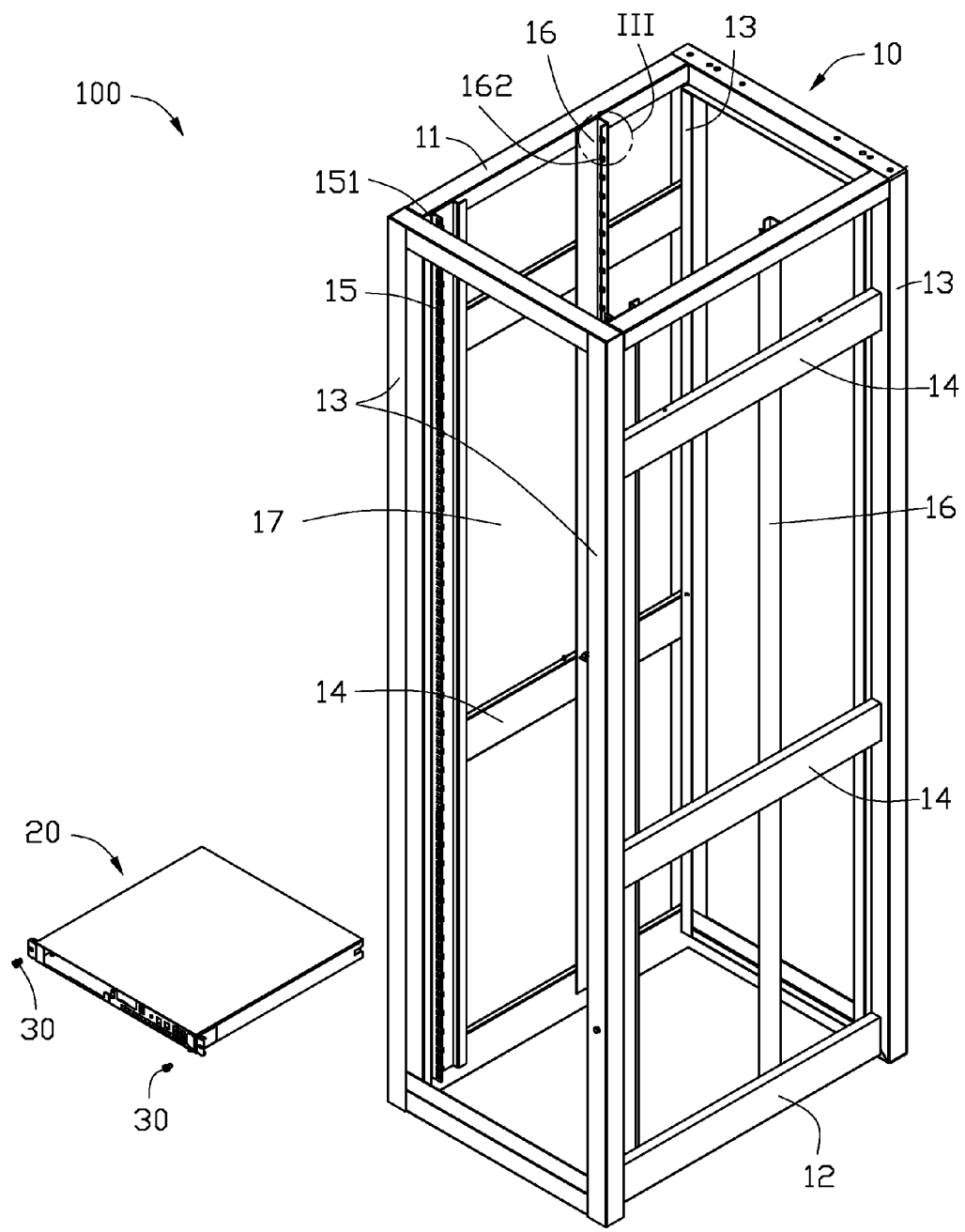
FIG. 1 is an exploded, isometric view of a computer server system in accordance with an exemplary embodiment, in which, as illustration, only one server of the computer server system is shown.
Figure 2:
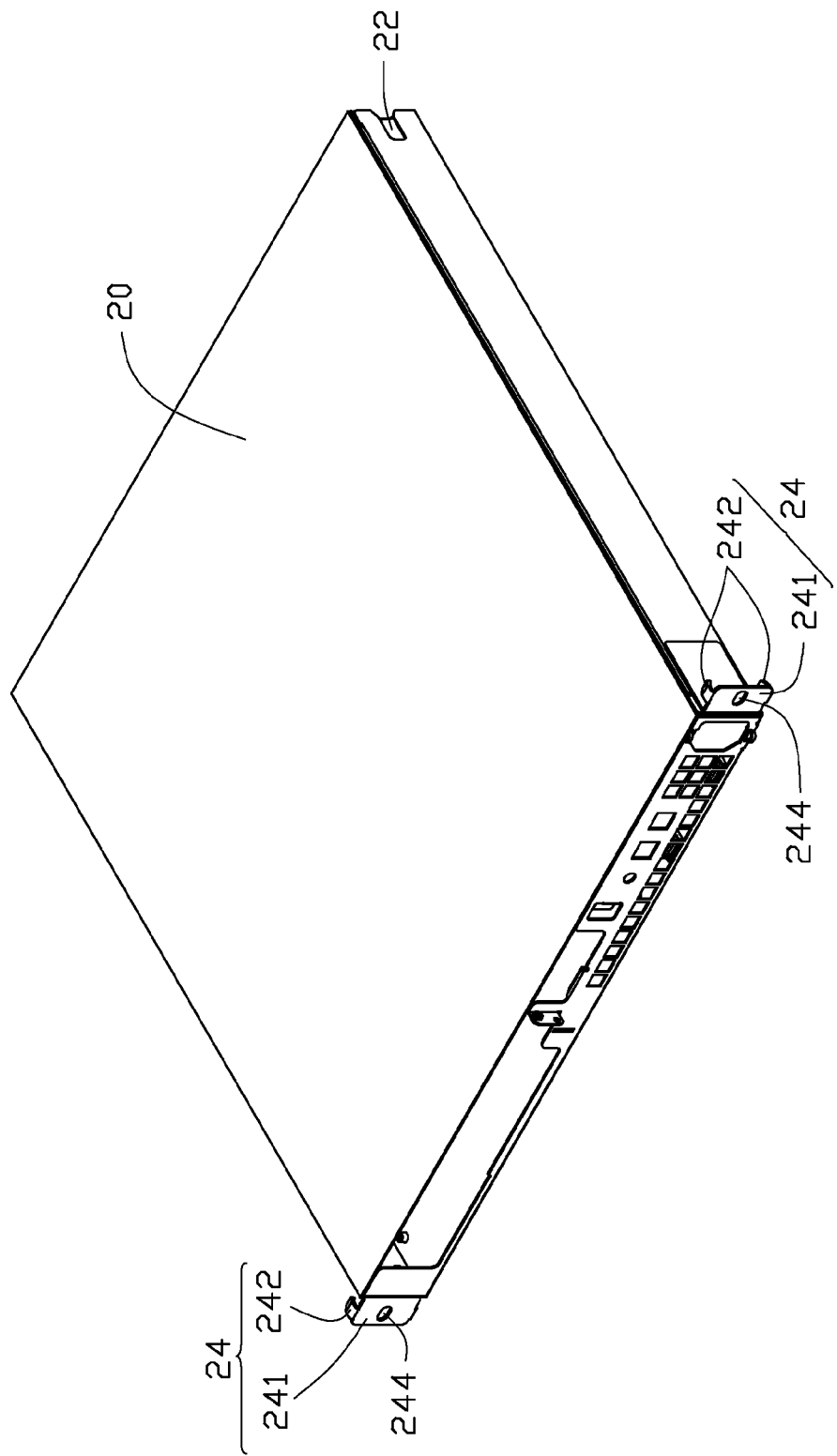
FIG. 2 is an isometric view of the server shown in FIG. 1.

Referring to FIGS. 1 and 2, a computer server system 100 according to an exemplary embodiment is shown in FIG. 1. The system 100 includes a server cabinet 10, and a plurality of servers 20 accommodated in the server cabinet 10. In this embodiment, only one server 20 is shown for clarity.

The server 20 is substantially rectangular. The server 20 defines a pair of mounting grooves 22 in left and right sides of a rear end of the server 20, respectively. Each mounting groove 22 extends forward from the rear end of the server 20 along one side of the server 20. The mounting grooves 22 are shorter in length than the server 20.

A pair of ears 24 are formed on the server 20, and extended outwardly from left and right sides of the front end of the server 20, respectively. Each ear 24 includes a main body 241, and two hooks 242 formed at top and bottom sides of the main body 241, respectively. The main body 241 is in the form of a plate. A through hole 244 is defined in a central portion of the main body 241 of each ear 24. Each hook 242 curves back from the main body 241 towards but not contacting the other hook 242.

The server cabinet 10 includes a top frame 11, a bottom frame 12 parallel to and spaced from the top frame 11, and four supporting pillars 13 located at four corners of the frame 11 and connecting the top frame 11 to the bottom frame 12, respectively. The top and bottom frames 11, 12 have the same rectangular shape and size. A plurality of beams 14 is provided at the left and right sides of the server cabinet 10 to interconnect the corresponding supporting pillars 13. The beams 14 are parallel to each of the top and bottom frames 11, 12, and are perpendicularly connected to the supporting pillars 13. The beams 14 provide mechanical strength to the server cabinet 10.

A pair of first mounting pillars 15 and a pair of second mounting pillars 16 also connect the top frame 11 to the bottom frame 12. Each of the first mounting pillars 15 and the second mounting pillars 16 is parallel to the supporting pillars 13, and is perpendicular to the top and bottom frames 11, 12, respectively. The first and second mounting pillars 15, 16 are connected to the beams 14, respectively. A first mounting pillar 15 and a second mounting pillar 16 are located at the left side of the server cabinet 10, and the other first mounting pillar 15 and the other second mounting pillar 16 are located at the right side of the server cabinet 10. The first mounting pillars 15 are respectively located adjacent to the front supporting pillars 13. Each first mounting pillar 15 is connected to a corresponding front supporting pillar 13. Each second mounting pillar 16 is located at approximately in the middle of a corresponding side of the server cabinet 10. The second mounting pillars 16 are located closer to the rear supporting pillars 13 than to the front supporting pillars 13. The first mounting pillars 15 and the second mounting pillars 16 cooperatively define a space 17 therebetween. A size of the space 17 in transverse cross section is substantially equal to the size of the server 20. Thus, the server 20 can be fittingly received in the space 17 of the server cabinet 10.

Figure 3:
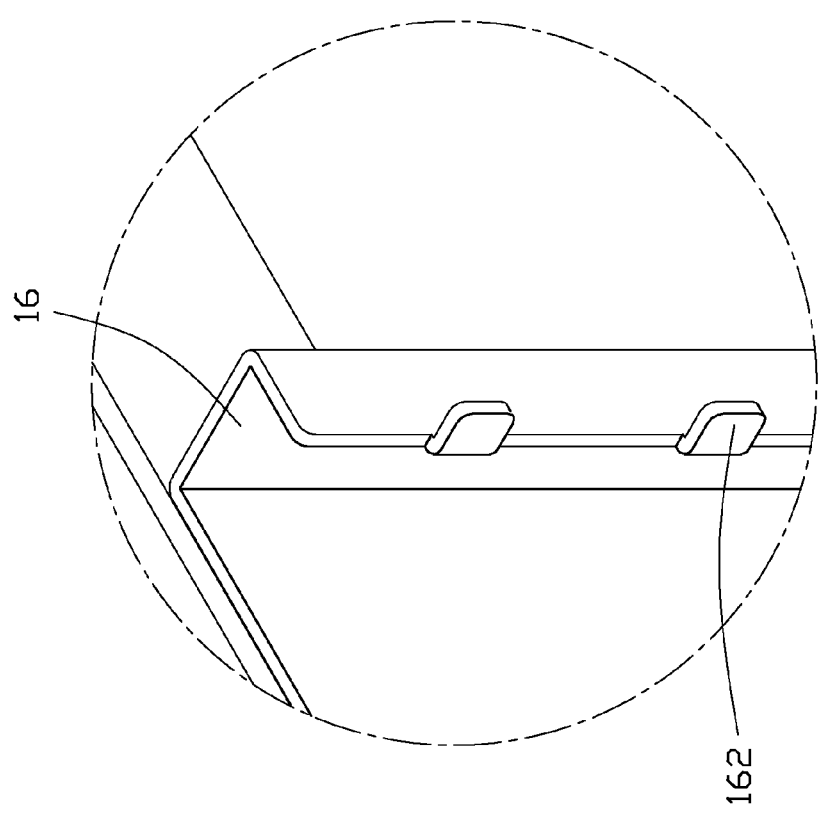
FIG. 3 is an enlarged view of the circled portion III of FIG. 1.

Referring also to FIG. 3, each of the second mounting pillars 16 forms a vertical array of a plurality of equidistantly spaced tab-like protrusions 162 extending towards the other second mounting pillar 16. The protrusions 162 of one second mounting pillar 16 are aligned with the protrusions 162 of another second mounting pillar 16, correspondingly. That is, the protrusions 162 of the pair of second mounting pillars 16 cooperatively form a plurality of pairs of protrusions 162. Each pair of protrusions 162 are located at the same level, and are respectively located on the second mounting pillars 16. A height of each of the protrusions 162 along a vertical direction is slightly less than a width of the mounting groove 22 along the vertical direction, and thus a pair of protrusions 162 can be respectively engageably received in the mounting grooves 22 of the server 20.

Figure 4:
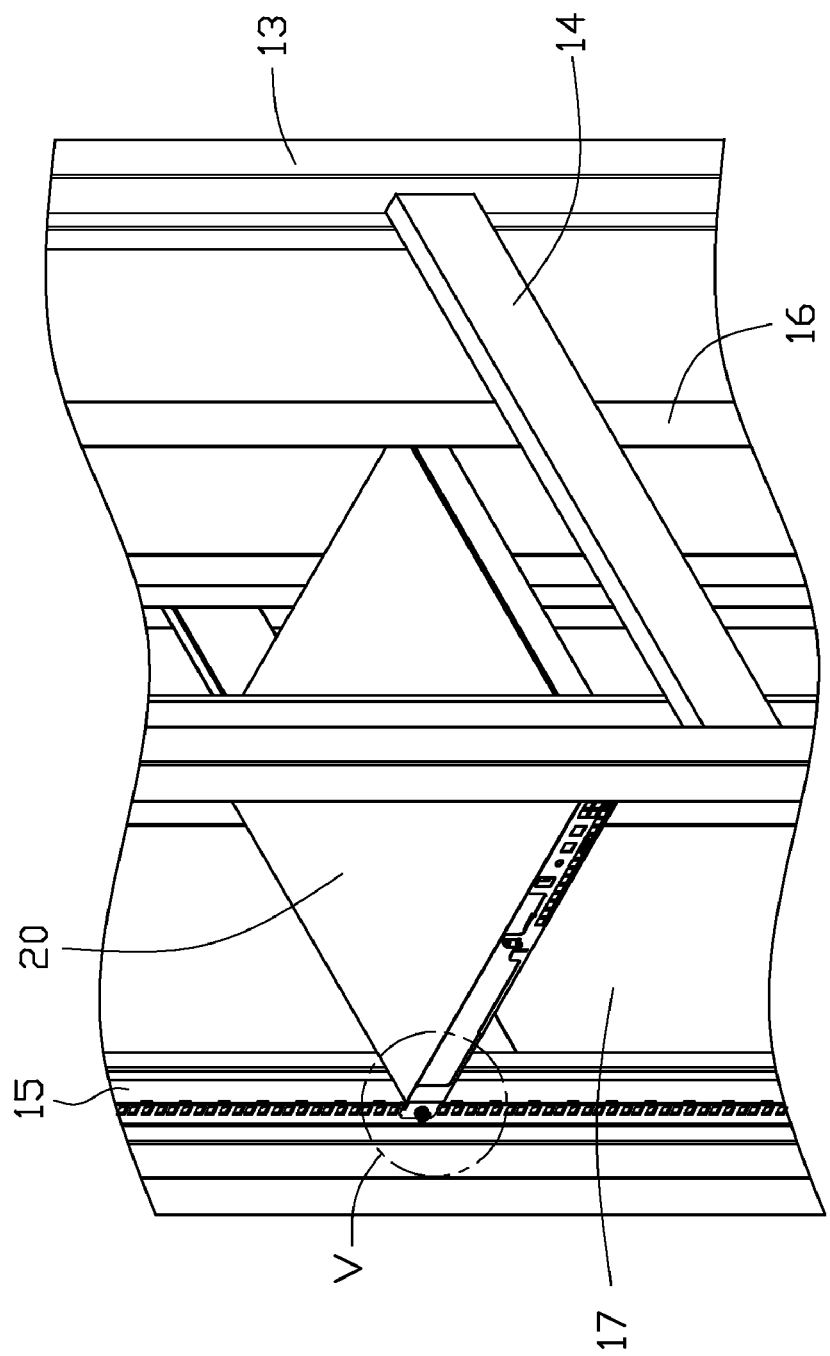
FIG. 4 is an isometric, assembled view of a part of the computer server system of FIG. 1.
Figure 5:
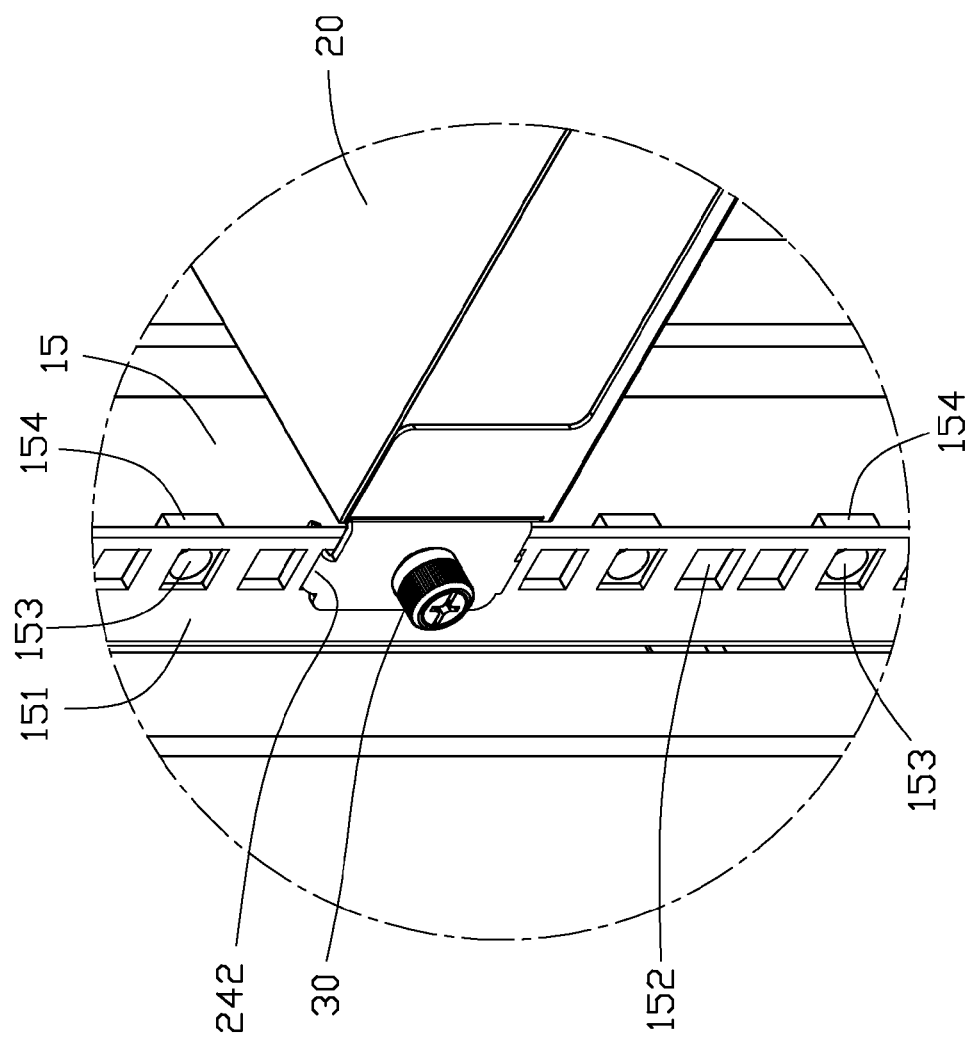
FIG. 5 is an enlarged view of the circled portion V of FIG. 4.
Figure 6:
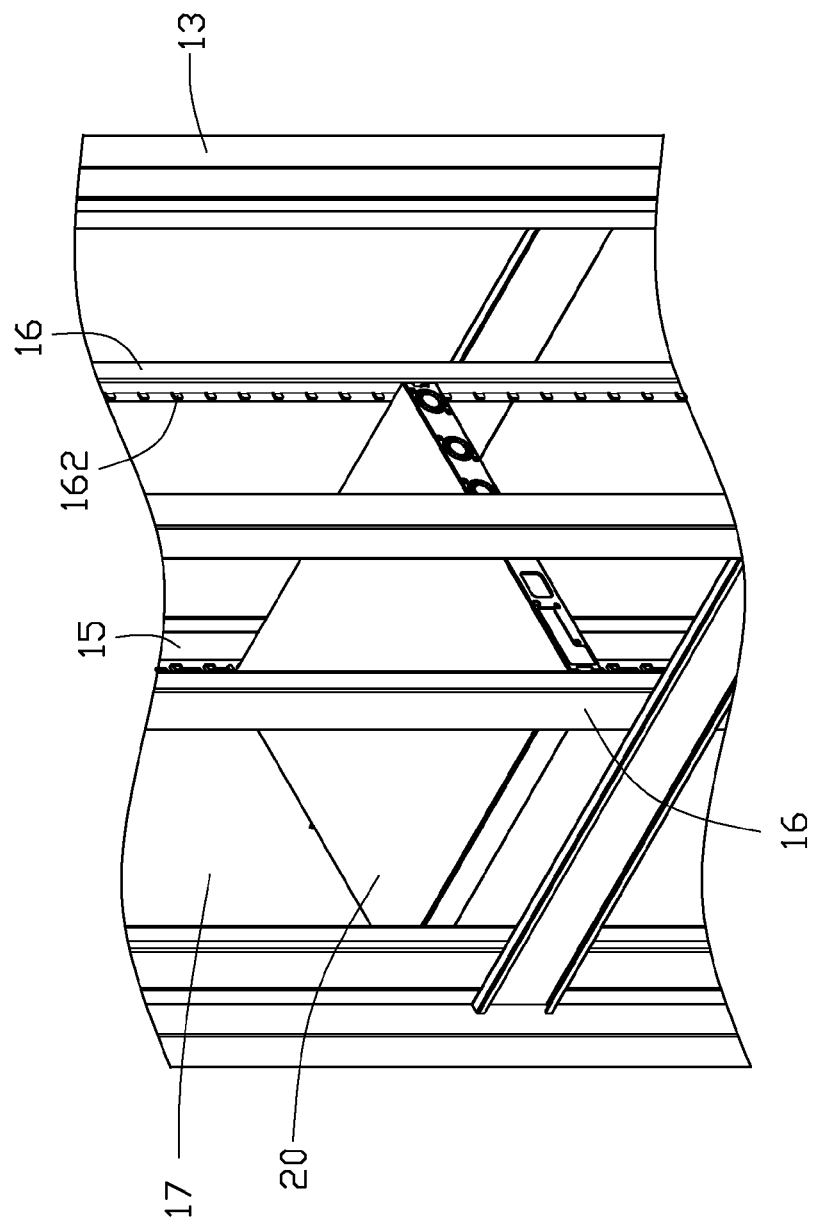
FIG. 6 is similar to FIG. 4, but viewed from another aspect.

Referring also to FIGS. 4 and 5, each of the first mounting pillars 15 includes a mounting plate 151 extending towards the other first mounting pillar 15. The mounting plate 151 vertically defines a plurality of mounting holes 153 and a plurality of engagement holes 152 therein, arranged in a pattern comprising of the following sequence, namely, two engagement holes 152, then followed by one mounting hole 153, and then the sequence is repeated with the two holes 152 and so on for the remaining length of the mounting plate 151. A nut 154 corresponding to each of the mounting holes 153 is fixed to the mounting plate 151. The mounting holes 153 on one first mounting pillar 15 are respectively aligned with the mounting holes 153 on the other first mounting pillar 15; and the engagement holes 152 on one first mounting pillar 15 are respectively aligned with the engagement holes 152 on the other first mounting pillar 15. After the server 20 is placed in the server cabinet 10, the through hole 244 of each ear 24 of the server 20 is aligned with a mounting hole 153 of a corresponding first mounting pillar 15, and the hooks 242 of the ear 24 of the server 20 engage with the engagement holes 152 located at the top and bottom sides of the mounting hole 153. Thus, the ears 24 of the server 20 are supported by the first mounting pillars 15.

Referring to FIGS. 1-6, in assembly, the mounting grooves 22 of the server 20 are aligned with a pair of protrusions 162 on the second mounting pillars 16. The server 20 is pushed inwardly to allow the protrusions 162 of the second mounting pillars 16 to engage in the mounting grooves 22 of the server 20. Thus, the rear end of the server 20 is fixed on the second mounting pillars 16 of the server cabinet 10. Simultaneously, the hooks 242 of each ear 24 of the server 20 are aligned with a corresponding pair of engagement holes 152 of a corresponding first mounting pillar 15, and the through hole 244 of the main body 241 of each ear 24 is aligned with the mounting hole 153 located between the pair of engagement holes 152. As the server 20 is pushed towards the rear of the server cabinet 10, the protrusions 162 of the second mounting pillars 16 abut against the left and right sides of the server 20 in the front ends of the mounting grooves 22, and the hooks 242 of each ear 24 of the server 20 engage in the engagement holes 152 of the first mounting pillars 15. Thus, the front end of the server 20 is supported on the first mounting pillars 15 of the server cabinet 10. The through hole 244 of the main body 241 of each ear 24 is aligned with the mounting hole 153 of the first mounting pillar 15 between the two engagement holes 152 in which the hooks 242 of the ear 24 are respectively engaged. Thus, a screw 30 can be provided to extend through the through hole 244 of the ear 24 and engaged with the nut 154 in the mounting hole 153 of the first mounting pillar 15, to further fix the server 20 onto the server cabinet 10 more firmly.

In this embodiment, the server 20 is fixed to the server cabinet 10 more easily, with four corners thereof mounted on the first mounting pillars 15 and the second mounting pillars 16, respectively. The more complicated rails of commonly used computer server systems are thereby omitted. In addition, a plurality of fixing structures of the computer server system 100, i.e., the mounting grooves 22 of the server 20 and the protrusions 162 of the server cabinet 10 which are matching with the mounting grooves 22, the ears 24 of the server 20 and the mounting holes 153 and the engagement holes 152 of the server cabinet 10 matching with the ears 24, are easier to manufacture. Thus, the manufacturing costs of the computer server system 100 can be reduced.

It is to be understood, however, that even though numerous characteristics and advantages of the exemplary embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A computer server system, comprising:
a server cabinet and at least one server accommodated in the server cabinet, the at least one server forming a fixing structure at each of four corners thereof, the four corners of the at least one server mounted to the server cabinet by means of the fixing structures formed at the four corners of the at least one server, wherein the at least one server defines a pair of mounting grooves located only at a rear end thereof, the pair of mounting grooves are located at two sides of the at least one server and function as two of the fixing structures of the at least one server, a pair of protrusions are formed only at two sides of a rear end of the server cabinet, respectively, the pair of protrusions of the server cabinet match with the pair of mounting grooves of the at least one server, and the pair of protrusions of the server cabinet are received in the pair of mounting grooves of the at least one server, respectively.

2. The computer server system of claim 1, wherein the at least one server forms a pair of ears at a front end thereof, the pair of ears are located at the two sides of the at least one server and function as the other two of the fixing structures of the at least one server, a through hole is defined in each of the ears, a pair of mounting holes are defined at two sides of a front end of the server cabinet, respectively, the pair of mounting holes are aligned with the through holes of the at least one server, respectively, and a plurality of screws extend through the through holes of the at least one server and engage in the mounting holes of the server cabinet to secure the front end of the at least one server on the server cabinet.

3. The computer server system of claim 2, wherein a nut is fixed in each of the mounting holes.

4. The computer server system of claim 2, wherein each ear of the at least one server forms at least one hook thereon, the server cabinet defines a plurality of engagement holes at the front end thereof, and the hooks of the at least one server are engaged in the engagement holes to support the front end of the at least one server on the server cabinet.

5. The computer server system of claim 4, wherein the at least one hook of each ear of the at least one server comprises two hooks formed at top and bottom sides of the ear, and the plurality of engagement holes of the server cabinet comprises a pair of engagement holes located at top and bottom sides of each mounting hole, respectively.

6. The computer server system of claim 4, wherein the server cabinet comprises a pair of first mounting pillars defining the mounting holes and the engagement holes therein, and a pair of second mounting pillars forming the protrusions thereon.

7. The computer server system of claim 6, wherein the server cabinet comprises a top frame, a bottom frame, and four supporting pillars connected between the top frame and the bottom frame, and the supporting pillars are respectively located at four corners of the server cabinet.

8. The computer server system of claim 7, wherein the first mounting pillars and the second mounting pillars connect the top frame to the bottom frame, the first mounting pillars are located adjacent to the front end of the server cabinet, and the second mounting pillars are located adjacent to middle portions of two opposite sides of the server cabinet, respectively.

9. The computer server system of claim 7, wherein the server cabinet further comprises a plurality of beams at left and right sides thereof to interconnect the corresponding supporting pillars together.

* * * * *

UNITED STATES PATENT AND TRADEMARK OFFICE
CERTIFICATE OF CORRECTION

PATENT NO. : 8,369,087 B2  
APPLICATION NO. : 12/795609  
DATED : February 5, 2013  
INVENTOR(S) : Wu et al.

Page 1 of 1

It is certified that error appears in the above-identified patent and that said Letters Patent is hereby corrected as shown below:

On the title page, item [30] "Foreign Application Priority Data" should read as follows:

(30)  Foreign Application Priority Data

April 27, 2010  (CN) .........................2010 1 0157120

Signed and Sealed this
Fifteenth Day of October, 2013

Teresa Stanek Rea
*Deputy Director of the United States Patent and Trademark Office*